US011841810B2

(12) United States Patent
Banerjee et al.

(10) Patent No.: US 11,841,810 B2
(45) Date of Patent: Dec. 12, 2023

(54) COMMUNICATION INTERFACE BUFFER WITH HOT-SWAP PROTECTION

(71) Applicant: Texas Instruments Incorporated, Dallas, TX (US)

(72) Inventors: Suvadip Banerjee, Bengaluru (IN); Sreeram Subramanyam Nasum, Bengaluru (IN); Anant Shankar Kamath, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 193 days.

(21) Appl. No.: 17/244,370

(22) Filed: Apr. 29, 2021

(65) Prior Publication Data

US 2022/0107909 A1 Apr. 7, 2022

(30) Foreign Application Priority Data

Oct. 1, 2020 (IN) .............................. 202041042768

(51) Int. Cl.
*G06F 13/20* (2006.01)
*G06F 13/40* (2006.01)
*H03K 17/687* (2006.01)
*G06F 13/42* (2006.01)

(52) U.S. Cl.
CPC .......... *G06F 13/20* (2013.01); *G06F 13/4086* (2013.01); *H03K 17/6871* (2013.01); *G06F 13/4282* (2013.01); *G06F 2213/0016* (2013.01)

(58) Field of Classification Search
CPC .................................. G06F 19/00; H02H 3/16
See application file for complete search history.

(56) References Cited

U.S. PATENT DOCUMENTS

| 6,810,458 | B1 | 10/2004 | Bazargan et al. |
| 11,329,472 | B2* | 5/2022 | Roy ....................... H02H 3/093 |
| 2014/0093881 | A1* | 4/2014 | Sugnet .................... H03M 7/30 |
| | | | 435/6.12 |

(Continued)

FOREIGN PATENT DOCUMENTS

| CN | 203553934 U | 4/2014 |
| WO | 2002067279 A2 | 8/2002 |

OTHER PUBLICATIONS

International Search Report, PCT/US2021/053079, dated Dec. 16, 2021, 2 pgs.

*Primary Examiner* — Getente A Yimer
(74) *Attorney, Agent, or Firm* — John R. Pessetto; Frank D. Cimino

(57) ABSTRACT

A communication interface buffer comprises: a data bus connection adapted to be coupled to a bus interface contact; and a ground. The communication interface buffer also comprises an output transistor with a first current terminal, a second current terminal and a control terminal, the first current terminal coupled to the data bus connection, the second current terminal coupled to ground, and the control terminal adapted to receive a drive signal. The communication interface buffer also comprises a control circuit coupled to the control terminal of the output transistor, wherein the control circuit is configured to: turn off the output transistor during a first interval that starts when the data bus connection is coupled to the bus interface contact; and turn on the output transistor after the first interval is complete.

16 Claims, 9 Drawing Sheets

(56) References Cited

U.S. PATENT DOCUMENTS

| | | | | |
|---|---|---|---|---|
| 2020/0119540 A1* | 4/2020 | Buhari | ............... | H03K 17/0822 |
| 2021/0034563 A1* | 2/2021 | Khan. P | .............. | G06F 13/4081 |
| 2022/0209821 A1* | 6/2022 | Eriksen | .............. | H01R 13/6683 |

* cited by examiner

COMMUNICATION INTERFACE BUFFER WITH HOT-SWAP PROTECTION

CROSS-REFERENCE TO RELATED APPLICATIONS

This application claims priority to India Provisional Application No. 202041042768, filed Oct. 1, 2020, which is hereby incorporated by reference.

BACKGROUND

As new electronic devices are developed and integrated circuit (IC) technology advances, new IC products are commercialized. One example IC product for electronic devices is a communication interface buffer. Such communication interface buffers are often used between electronic devices or ICs sharing a communication interface. In some examples, the communication interface buffer and an additional circuit (that may include a transceiver) are part of a printed circuit board (PCB) card. The additional circuit may perform processing, sensing, storage, other operations, and/or related communications. After a PCB is plugged into a compatible connector of a system or device, communications between the additional circuit and the system or device are buffered by the communication interface buffer to help ensure data integrity.

In some scenarios, a PCB card is inserted into or removed from a compatible connector while power/communications is off. This type of plugging/unplugging activity (when the system or device is turned off) may be referred to as a cold-swap or cold-swapping. On the other hand, when a PCB card is inserted into or removed from a compatible connector while power/communications in on, the plugging activity may be referred to as a hot-swap or hot-swapping.

In conventional approaches, hot-swapping is supported for PCB cards by contact length variance and specialty connectors. These conventional approaches undesirably increase the cost of a PCB card and/or the related device or system. An example device/system may support many PCB cards using compatible connectors and a communication backplane. Once a PCB card is plugged into a compatible connector of the device/system, the PCB card is powered and related components/ICs are able to communicate via a communication interface buffer and a shared communication interface to other components/ICs of the device/system. The other components/ICs may be mounted on other PCB cards or a motherboard of the device/system. Without contact length variance and specialty connectors, hot-swap of a PCB card may corrupt data carried by a shared communication interface or system bus due to the voltage levels for data on the system bus being affected by the hot-swap.

One example communication interface used in devices/systems and affected by the above-noted issues is an I2C communication interface. FIG. 1 is a schematic diagram of an I2C driver 100 in accordance with a conventional approach. As an example, the I2C driver 100 may be part of a communication interface buffer on a PCB card. As shown, the I2C driver 100 includes a voltage supply input 104, a transmit data input (TX_IN) 112, a ground 108, and an I2C bus connection 110. Other components of the I2C driver 100 include transistors M1, M2 and M3, buffer 106, resistors R1 and R2, and capacitor C1 in the arrangement shown in FIG. 1. With the I2C driver 100, R1, R2, and C1 form a slew rate control circuit 102 for transitions to the I2C bus connection 110. With the I2C driver 100, signaling from TX_IN 112 to the I2C bus connection 110 occurs as needed once the related PCB card and communication interface buffer with the I2C driver 100 is powered.

During a hot-swap event, there may already be signaling on an I2C bus before a PCB card is plugged into a compatible connector. FIG. 2 is a timing diagram 200 of signals related to a hot-swap event without hot-swap protection (e.g., without contact length variance and specialty connectors). The signals in the timing diagram 200 include a contact-with-bus signal (CONTACT_W_BUS), an I2C bus data signal (I2C_BUS_DATA), and a drive signal (DRIVE_GATE) for M3 of the I2C driver 100. As shown, CONTACT_W_BUS transitions from low-to-high (0 to 1V) at 10 us, which means a related PCB card contact for the I2C bus connection 110 is coupled to a respective I2C bus contact in a connector of an electronic device or system. For a time after CONTACT_W_BUS goes high, the "high" or "1" voltage level for I2C_BUS is lower than a target voltage level, which potentially corrupts data bits of I2C_BUS_DATA. After CONTACT_W_BUS goes high, DRIVE_GATE begins to transition up and down, which causes distortion to I2C_BUS_DATA.

To avoid the bit corruption due to hot-swap events as described in FIG. 2, PCB cards of a system may use staggered contacts as previously noted. FIG. 3 is a diagram of a system 300 with PCB cards 312A-312N in accordance with a conventional approach. In the system 300, the PCB cards 312A-312N can be plugged into or unplugged from an electrical device 302 (e.g., a data center server or other electrical device) with connectors 304A-304N and an I2C backplane 308 with traces 306A-306N extending to each of the connectors 304A-304N.

As shown, the PCB card 312A includes contacts 318A, 318B, 318C and 318D, which vary in length. The contact 318A is a serial data input (SDAIN) contact. The contact 318E is a ground (GND) contact. The contact 318C is a serial clock input (SCLIN) contact. The contact 318D is a power supply (Vcc) contact. As shown, the contact 318B for GND is longest, which means GND will be first to connect when plugging the PCB card 312A into the connector 304A. When unplugging the PCB card 312A from the connector 304A, GND will be last to disconnect. The contact 318D for Vcc is next longest after the GND contact (e.g., the Vcc contact has an offset 320C of 25 mil, or another amount, relative to the contact 318B for GND), which means Vcc will be second to connect when plugging the PCB card 312A into the connector 304A. When unplugging the PCB card 312A from the connector 304A, Vcc will be second last to disconnect. The contact 318A for SDAIN and the contact 318C for SCLIN are the shortest contacts (e.g., the SDAIN and SCLIN contacts have respective offsets 320A and 320B of 50 mil, or another amount, relative to the contact 318B for GND), which means SDAIN and SCLIN will be last to connect when plugging the PCB card 312A into the connector 304A. When unplugging the PCB card 312A from the connector 304A, SDAIN and SCLIN will be first to disconnect.

In FIG. 3, the PCB card 312A also includes a communication interface buffer circuit 314 coupled to the contacts 318A-318D via respective traces 316A-316D. The communication interface buffer circuit 314 is also coupled to another component 316 configured to perform target processing, sensing, storage, and/or other operations of the PCB card 312A as well as support I2C-compatible communications. The PCB cards 312B-312N have the same components as the PCB card 312A, except that the other component 316 may vary with regard to type and related target operations. While use of staggered contacts for the PCB cards 312A-312N is effective in avoiding corrupted bits due to hot-swapping events, the staggered contacts increases the expense of each of the PCB cards 312A-312N and/or the expense of the respective connectors 304A-304N and the related electrical device 302.

SUMMARY

In at least one example, a communication interface buffer comprises: a data bus connection adapted to be coupled to a bus interface contact; and a ground. The communication interface buffer also comprises an output transistor with a first current terminal, a second current terminal and a control terminal, the first current terminal coupled to the data bus connection, the second current terminal coupled to ground, and the control terminal adapted to receive a drive signal. The communication interface buffer also comprises a control circuit coupled to the control terminal of the output transistor. The control circuit is configured to: turn off the output transistor during a first interval that starts when the data bus connection is coupled to the bus interface contact; and turn on the output transistor after the first interval is complete.

In another example, a system comprises: a component configured to perform a target operation and related communications; a set of contacts adapted to be coupled to a connector; and a communication interface buffer between the component and the set of contacts. The communication interface buffer includes: a bus signal driver circuit with a data bus connection and a control circuit. The control circuit is configured to change the impedance at the data bus connection to be a first impedance during a first interval and a second impedance during a second interval after the first interval, and the first impedance greater than the second impedance.

In yet another example, a driver circuit comprises: a signal input; a signal output; and an output transistor having a first control terminal, a first current terminal and a second current terminal, the first current terminal coupled to the signal output and the second current terminal coupled to a common potential that is adapted to be coupled to ground. The driver circuit also comprises a first disable transistor having a second control terminal, a third current terminal and a fourth current terminal, the third current terminal coupled to the first control terminal, the fourth current terminal coupled to the common potential. The driver circuit also comprises a second disable transistor having a third control terminal, a fifth current terminal and a sixth current terminal, the third control terminal coupled to a control signal, the fifth current terminal coupled to the signal output through a first capacitor and the sixth current terminal coupled to the common potential.

In yet another example, a method comprises: detecting, by a communication interface buffer, a hot-plug event involving a printed circuit board (PCB) card on which the communication interface buffer is mounted; and disabling, by the communication interface buffer, an output transistor of a bus signal driver circuit included with the communication interface buffer responsive to detecting the hot-plug event. The method also comprises detecting, by the communication interface buffer, that the hot-plug event is complete; and enabling, by the communication interface buffer, the output transistor of the bus signal driver circuit responsive to detecting the hot-plug event is complete.

BRIEF DESCRIPTION OF THE DRAWINGS

The same reference numbers are used in the drawings to depict the same or similar (functionally and/or structurally) features.

DETAILED DESCRIPTION

Figure 1:
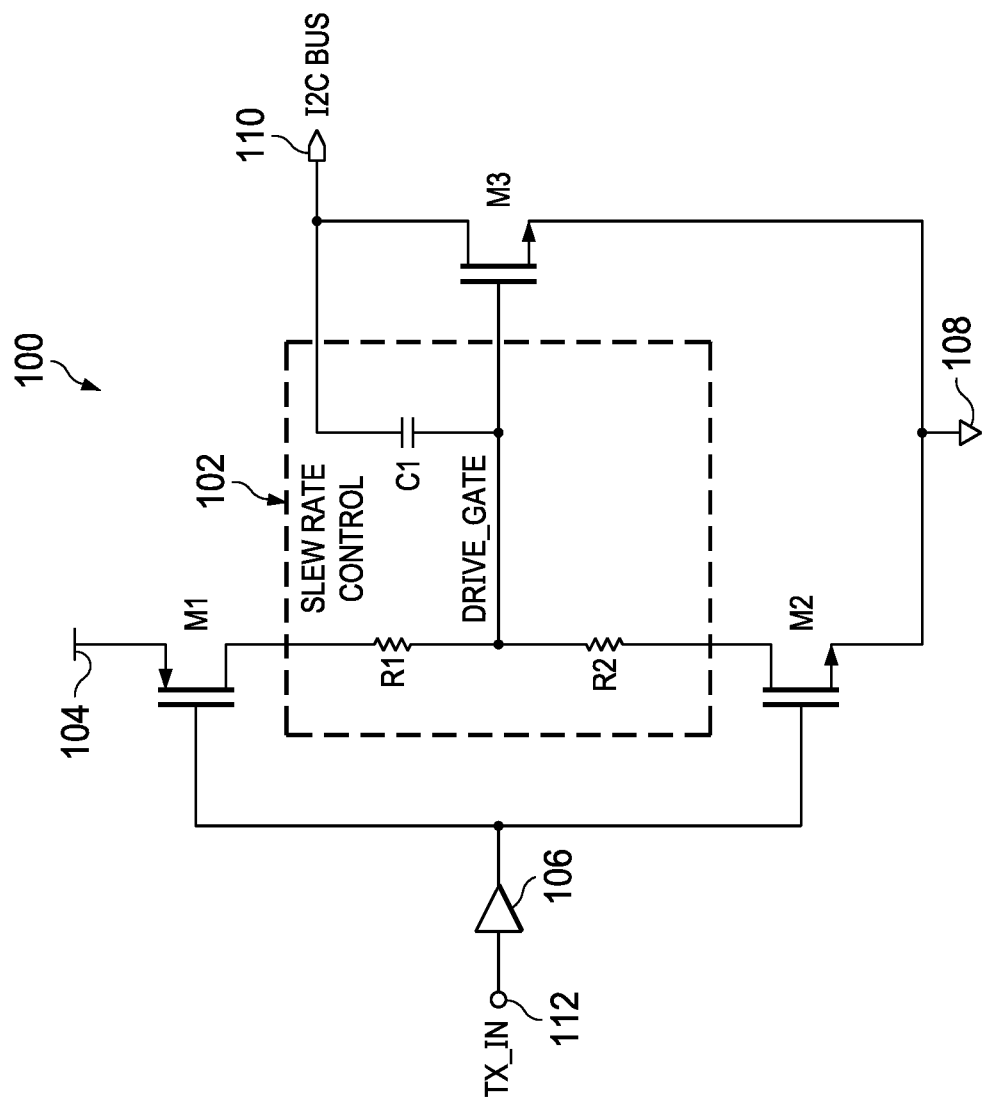
FIG. 1 is a schematic diagram of an I2C driver in accordance with a conventional approach.

Described herein is a communication interface buffer with a bus signal driver circuit topology that is high-impedance during hot-swap events. In some example embodiments, the communication interface buffer is an integrated circuit (IC) or part of an IC. In some example embodiments, the communication interface buffer is configured to support different ground levels (i.e., an isolation buffer). In other example embodiments, the communication interface buffer is configured to support one ground level (i.e., a buffer). Without limitation, the communication interface buffer may be an I2C buffer or another serial interface buffer.

In some example embodiments, the communication interface buffer is part of a hot-swappable printed circuit board (PCB) card. With the described communication interface buffer and related bus signal driver circuit topology, staggered contacts for the hot-swappable PCB card can be avoided. Avoiding staggered contacts reduces the overall cost of the PCB card and/or reduces the cost of related connectors for an electronic device or system that accepts PCB cards.

During a plug-in hot-swap event (e.g., plugging a PCB card into its respective connector in an electrical device or system that is powered on), the output transistor of the bus signal driver circuit topology stays off until a supply voltage for the bus signal driver circuit is available and settled. With the output transistor off, the bus signal driver circuit topology has a high-impedance during the plug-in hot-swap event that prevents existing signals on a system bus from being pulled down and corrupted due to the plug-in hot-swap event. After the plug-in hot-swap event is complete, the described bus signal driver circuit topology turns on the output transistor, which enables signaling through the bus signal driver circuit topology. As an example, such signaling may be occur via respective bus signal driver circuits and any communication interface buffers positioned between a first component on a first PCB card and a second component on a second PCB card. In this example, each PCB card is coupled to a shared communication interface of an electronic device or system using compatible connectors, where the communication interface buffers help maintain signaling quality on the shared communication interface. In the described embodiments, the signaling quality on the shared communication interface is maintained even during hot-swap events without the cost of staggered contacts and related specialty connectors.

During an unplug hot-swap event (e.g., unplugging a PCB card from its respective connector in a system while the system is powered on), loss of the power supply to the communication interface buffer results in the output transistor of the bus signal driver circuit topology being turned off quickly, which prevents existing signals on a system bus from being pulled down and corrupted due to the unplug event. In other words, the bus signal driver circuit topology is configured to be a high-impedance circuit during plug-in hot-swap events and unplug how-swap events.

Figure 4:
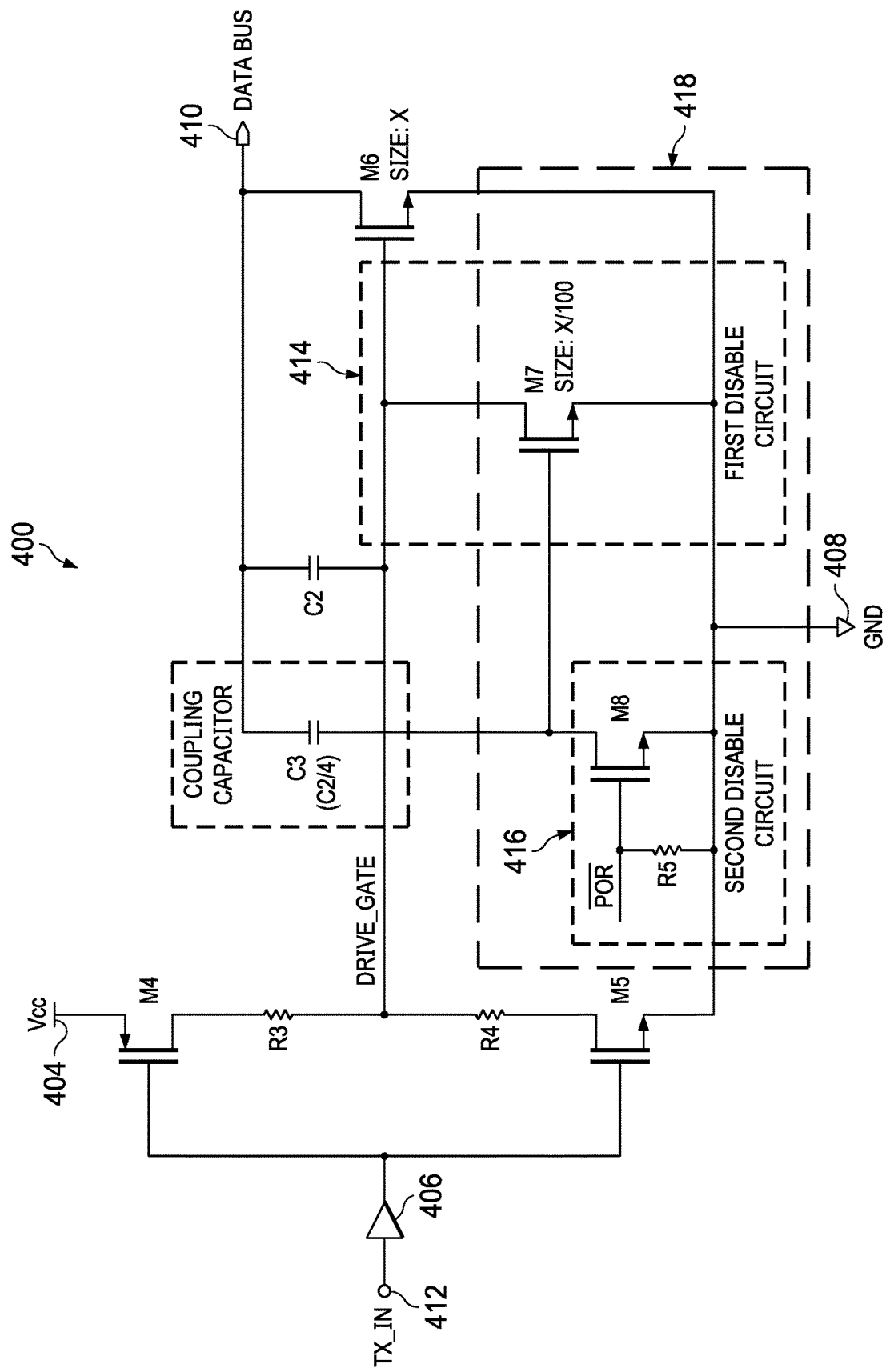
FIG. 4 is a schematic diagram of a bus signal driver circuit in accordance with an example embodiment.

FIG. 4 is a schematic diagram of a bus signal driver circuit 400 in accordance with an example embodiment. In some example embodiments, the bus signal driver circuit 400 is an I2C driver. As an example, the bus signal driver circuit 400 may be part of a communication interface buffer on a PCB card. As shown, the bus signal driver circuit 400 includes a power supply (Vcc) input 404, a transmit input (TX_IN) 412, a ground 408, and a communication bus (DATA_BUS) connection 410. Other components of the bus signal driver circuit 400 include transistors M4, M5, M6 and M8, buffer 406, resistors R3-R5, and capacitors C2 and C3 in the arrangement shown in FIG. 4. In the bus signal driver circuit 400, R3, R4, and C2 form a slew rate control circuit for transitions at the DATA_BUS connection 410. With the bus signal driver circuit 400, signaling from TX_IN 412 to the DATA_BUS connection 410 is possible once the related PCB card and buffer circuit with the bus signal driver circuit 400 is powered. In some example embodiments, power for the bus signal driver circuit 400 is received from the DATA_BUS connection 410. In such case, there is a small delay between when a PCB card (having a buffer circuit with the bus signal driver circuit 400) is plugged into a respective connector of an electronic device or system and when Vcc is available at the power supply input 404.

Relative to the I2C driver 100 of FIG. 1, the bus signal driver circuit 400 of FIG. 4 includes the coupling capacitor C3, a first disable circuit 414 to disable the output transistor M6 during a plug-in hot-swap event, and a second disable circuit 416 to disable the first disable circuit 414 once the plug-in hot-swap event is complete. When an unplug hot-swap event is performed, the power supply for the bus signal driver circuit 400 will remain high for few milliseconds because of supply storage and filter capacitors (e.g., on the related PCB). This ensures that M6 remains off through the R4 and M5 path throughout the unplug hot-swap event.

In the example of FIG. 4, the first disable circuit 414 and the second disable circuit 416 operate as a control circuit 418 for the bus signal driver circuit 400 to turn off M6 (or maintain M6 in an off-state) during a hot-swap event and to turn on M6 after the hot-swap event is complete. In the example of FIG. 4, the control circuit 418 is powered through C3 when the DATA_BUS connection 410 is coupled to a respective electronic device or system connector.

With the control circuit 418, the bus signal driver circuit 400 will be high-impedance when the bus signal driver circuit 400 and related buffer is unpowered or has unstable power (before and during a plug-in hot-swap event). During a plug-in hot-swap event, coupling of the DATA_BUS connection 410 to a respective contact of a connector results in a voltage at the DATA_BUS connection 410 (but not at the power supply input 404 yet) and activation of the first disable circuit 414. When the first disable circuit 414 is active, M6 is turned off and the bus signal driver circuit 400 will be high-impedance from the perspective of the electrical device/system being coupled to the bus signal driver circuit 400. Once the plug-in hot-swap event is complete (Vcc is available and stable), the second disable circuit 416 is activated, and the first disable circuit 414 is disabled (e.g., M7 is turned off). With the first disable circuit 414 disabled and Vcc available and stable, M6 will be turned on and the bus signal driver circuit 400 will operate normally, allowing communications to pass from TX_IN 412 to the DATA SUIS connection 410 as needed.

For the sake of completeness, a more detailed discussion of the components of the bus signal driver circuit 400 and their arrangement is now given. In the example of FIG. 4, M4 is a p-type metal-oxide semiconductor field effect transistor (p-MOSFET or just pMOS hereafter) with a first current terminal (e.g., a source terminal) coupled to the power supply input 404. The second current terminal (e.g., a drain terminal) of M4 is coupled to a first side of R3. The control terminal (e.g., a gate terminal) of M4 is coupled to the output of buffer 406. As shown, the input of the buffer 406 is coupled to TX_IN 412 (which, for example, is connected to circuitry, such as logic circuits, a processor, memory or other digital or analog devices, that provides data or other signals as to be provide over data bus 410 to other logic circuits, processors, memories or other digital or analog devices). The output of the buffer 406 is also coupled to the control terminal (e.g., a gate terminal) of M5, which is an n-type MOSFET (n-MOSTFET or just nMOS hereafter) in FIG. 4. As shown, a first current terminal (e.g., a source terminal) of M5 is coupled to a first side of R4, and a second current terminal (e.g., a drain terminal) of M5 is coupled to common potential 408, which may be connected to ground when bus signal driver circuit 400 is connected in the system. Also, the second sides of R3 and R4 as well as the control terminal (e.g., a gate terminal) of M6 (an nMOS transistor in FIG. 4) are coupled together. As shown, the first current terminal (e.g., a drain terminal) of M6 is coupled to the DATA_BUS connection 410 through capacitor C3, and the second current terminal (e.g., a source terminal) of M6 is coupled to ground 408.

During normal operations, the control signal ("DRIVE_GATE") for M6 follows the pattern of the signal at TX_IN 412. However, during hot-swap events, the bus signal driver circuit 400 temporarily disables M6 so that the bus signal driver circuit 400 has high-impedance at the DATA_BUS connection 410. To disable M6, the bus signal driver circuit 400 includes the first disable circuit 414, which is coupled to the control terminal of M6. In the example of FIG. 4, the first disable circuit 414 includes M7 (an nMOS transistor). In some example embodiments, M7 is sized smaller (e.g., the ratio of channel width/length is smaller) than M6 by a target amount (e.g., if the size of M6 is X, the size of M7 is X/100 or another ratio). In some example embodiments, transistor M7 will switch on/off faster than transistor M6 because M7 is smaller than M6, As shown, a first current terminal (e.g., a drain terminal) of M7 is coupled to the control terminal of M6, and a second current terminal (e.g., a source terminal) of M7 is coupled to ground 408. As shown, the control terminal (e.g., a gate terminal) of M7 is coupled to the DATA_BUS connection 410 via the coupling capacitor C3, which is smaller than C2 (e.g., C3 is at least 4 times smaller than slew rate control capacitor C2). Specifically, a first side of C3 is coupled to the DATA_BUS connection 410 and the second side of C3 is coupled to the control terminal of M7. Selecting C3 to be smaller than C2 ensures that, during a plug-in hot-swap event, the voltage at the control terminal of M7 ramps up before the voltage at the control terminal M6. In other words, M7 is turned on during a plug-in hot-swap event before M6, which pulls down DRIVE_GATE and prevents M6 from turning on. Making M7 smaller than M6 also helps ensure M7 will turn on before M6.

After a plug-in hot-swap event is complete, the bus signal driver circuit 400 transitions to normal operations, where M6 is turned on. In some example embodiments, M6 turns on when the first disable circuit 414 is turned off. In the example of FIG. 4, the control terminal (e.g., a gate terminal) of M6 is coupled to the DATA_BUS connection 410 via C2. Specifically, a first side of C2 is coupled to the DATA_BUS connection 410 and a second side of C2 is coupled to the control terminal of M6. To transition to normal operations, the second disable circuit 416 is activated to disable the first disable circuit 414. In the example of FIG. 4, the second disable circuit includes M8 (an nMOS transistor). More specifically, a first current terminal (e.g., a drain terminal) of M8 is coupled to the control terminal of M7 and the second side of C3. A second current terminal (e.g., a source terminal) of M8 is coupled to ground 408. The control terminal (e.g., a gate terminal) of M8 is coupled to the inverse of the power-on-reset control signal ($\overline{POR}$) or related circuitry, which indicates when Vcc at the power supply input 404 is available and stable. In the example of FIG. 4, a resistor R5 is coupled between the control terminal of M8 and ground 408. Specifically, a first side of R5 is coupled to the control terminal of M8, and a second side of R5 is coupled to ground 408.

Figure 5:
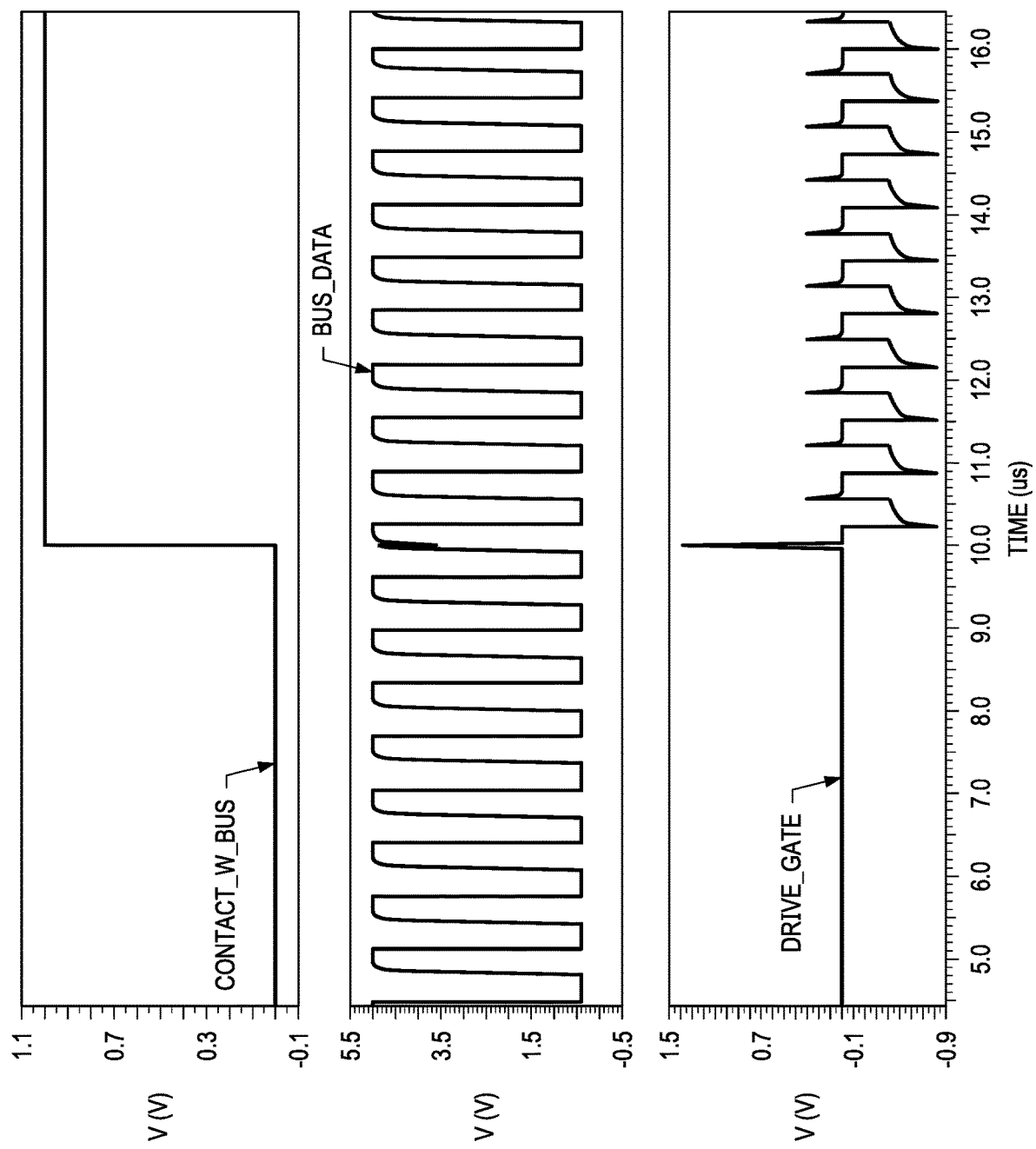
FIG. 5 is a timing diagram of signals related to a hot-swap event with hot-swap protection provided by the bus signal driver circuit of FIG. 4 in accordance with an example embodiment.

FIG. 5 is a timing diagram 500 of signals related to a hot-swap event with hot-swap protection provided by the bus signal driver circuit 400 of FIG. 4 in accordance with an example embodiment. For the timing diagram 500, it is assumed that staggered contacts are not needed to provide hot-swap protection. The signals in the timing diagram 500 include a contact-with-bus signal (CONTACT_W_BUS), a bus data signal (BUS_DATA, an example of the signal at the BUS_DATA connection 410), and a drive signal (DRIVE_GATE) for M6. As shown, CONTACT_W_BUS transitions from low-to-high at 10 us, which means a related PCB card contact for the DATA_BUS connection 410 is coupled to a respective bus contact (e.g., I2C bus contact) in a connector of an electronic device or system. As shown in the timing diagram 500, the transition of CONTACT_W_BUS from low-to-high does not significantly affect BUS_DATA voltage levels (the data bits remain uncorrupted). After CONTACT_W_BUS goes high, DRIVE_GATE starts transitioning, but does not significantly affect BUS_DATA.

Figure 6:
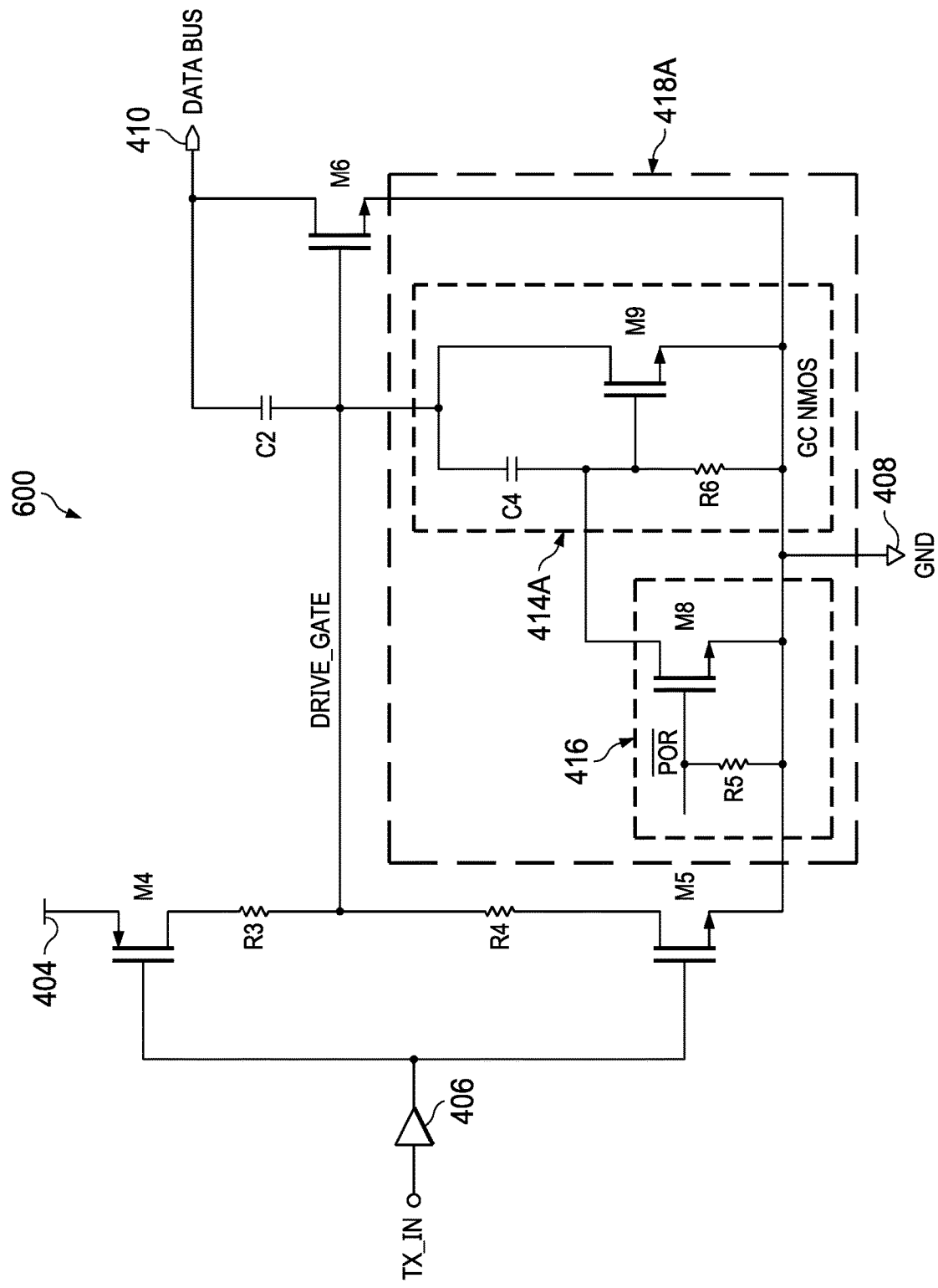
FIG. 6 is a schematic diagram of a bus signal driver circuit in accordance with another example embodiment.

FIG. 6 is a schematic diagram of a bus signal driver circuit 600 in accordance with another example embodiment. In some example embodiments, the bus signal driver circuit 600 is an I2C driver. As an example, the bus signal driver circuit 600 may be part of a communication interface buffer on a PCB card. As shown, the bus signal driver circuit 600 shares much in common with the bus signal driver circuit 400 with regard to components and their arrangement. The difference between the bus signal driver circuit 600 of FIG. 6 and the bus signal driver circuit 400 of FIG. 4 is that the first disable circuit 414A (an example of the first disable circuit 414 in FIG. 4) of the control circuit 418A (an example of the control circuit 418) varies from the first disable circuit 414 in FIG. 4. More specifically, the first disable circuit 414A includes a gate-coupled nMOS transistor M9 with a capacitor C4 and resistor R6 coupled to the control terminal of M9 in the arrangement shown. More specifically, C4 has a first side coupled to the control terminal of M6 and a second side coupled to the control terminal of M9 and to a first side of a resistor R6. The first side of R6 is also coupled to the first current terminal of M8. The first current terminal (e.g., a drain terminal) of M9 is coupled to the control terminal of M6. The second current terminal (e.g., a source terminal) of M9 is coupled to ground 408. In operation, the function of the bus signal driver circuit 600 is the same as the function of the bus signal driver circuit 400 with some variation in performance (the bus signal driver circuit 400 has higher impedance during hot-swap events compared to the bus signal driver circuit 600).

Figure 2:
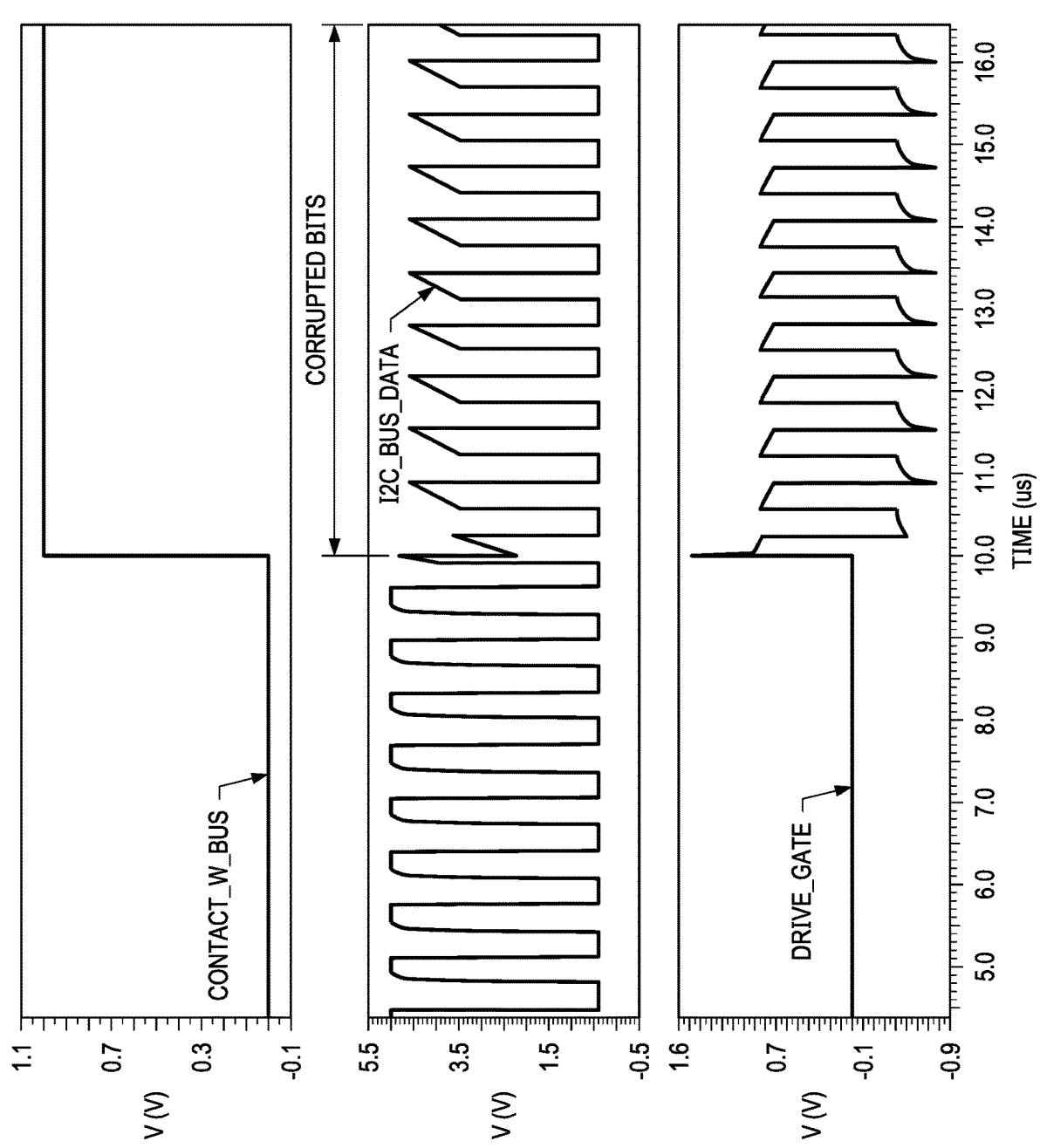
FIG. 2 is a timing diagram of signals related to a hot-swap event without hot-swap protection.
Figure 3:
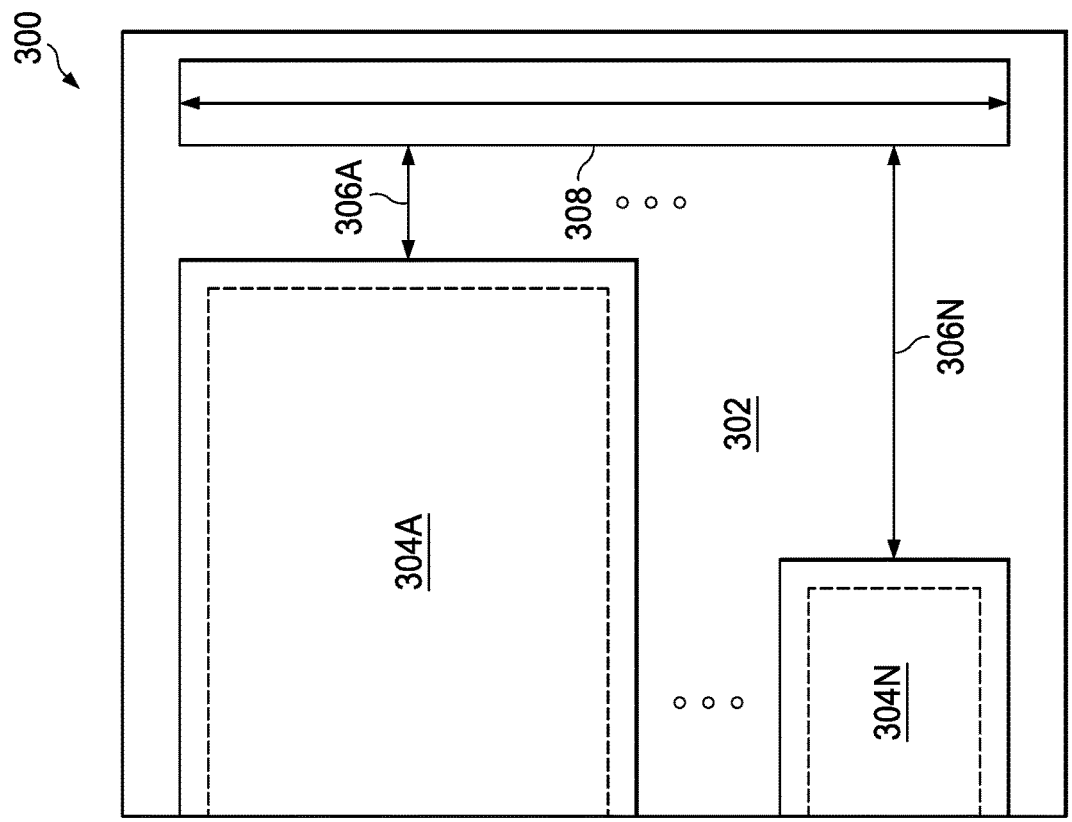
FIG. 3 is a diagram of a system with hot-swappable PCB cards in accordance with a conventional approach.
Figure 7:
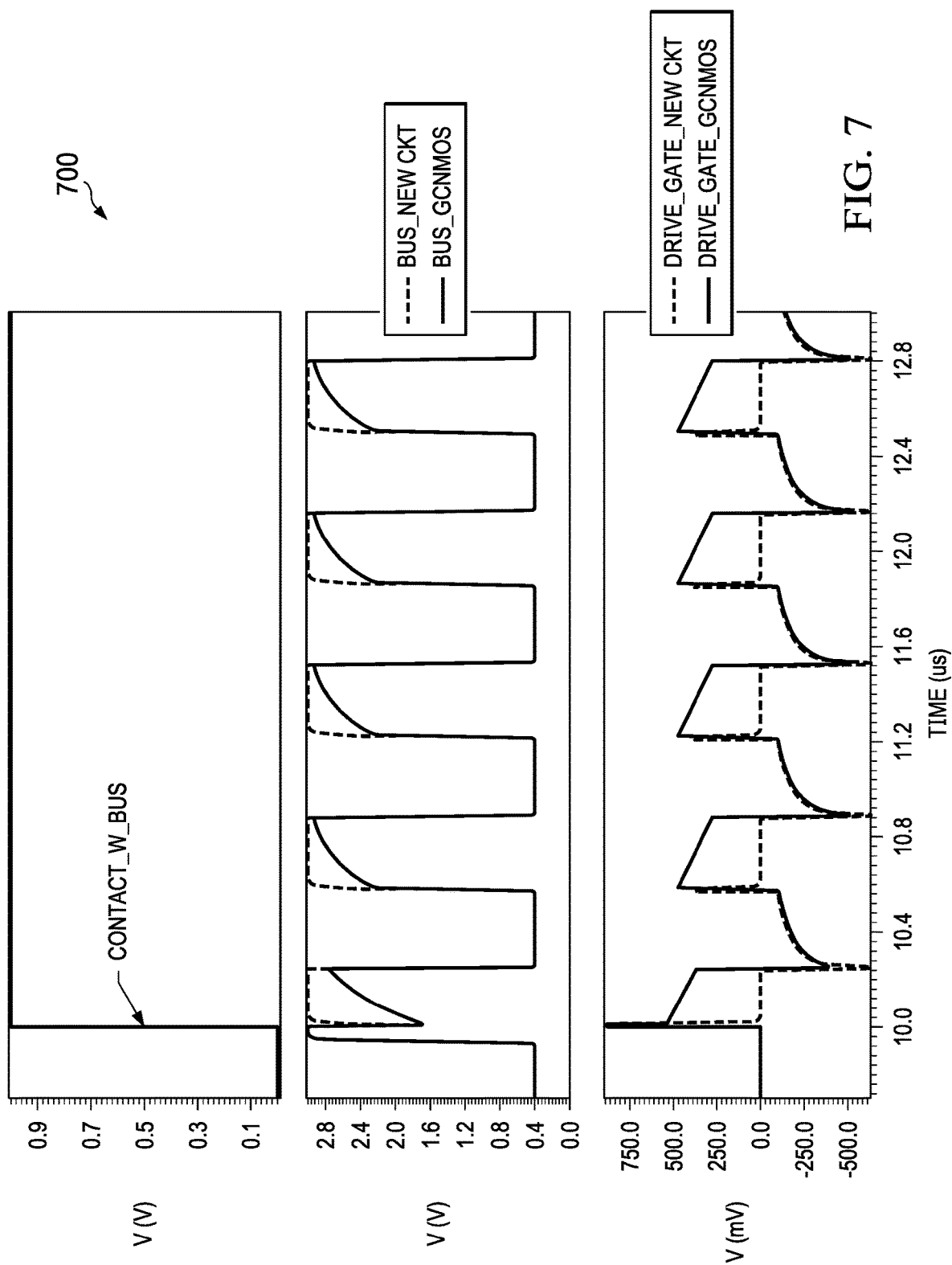
FIG. 7 is a timing diagram of signals related to a hot-swap event with hot-swap protection provided by the bus signal driver circuit of FIG. 6 in accordance with an example embodiment.

FIG. 7 is a timing diagram 700 of signals related to a hot-swap event with hot-swap protection provided by the bus signal driver circuits 400 and 600 of FIGS. 4 and 6 according to an example embodiment. For the timing diagram 700, it is assumed that staggered contacts are not needed to provide hot-swap protection. The signals in the timing diagram 700 include a contact-with-bus signal (CONTACT_W_BUS), a bus data signal (BUS_NEW CKT) for the bus signal driver circuit 400, and a drive signal (DRIVE_GATE_NEW CKT) for M6 of the bus signal driver circuit 400. The signals in the timing diagram 700 also include a bus data signal (BUS_GCNMOS) for the bus signal driver circuit 600, and a drive signal (DRIVE_GATE_GCNMOS) for M6 of the bus signal driver circuit 600. Compared to BUS_NEW CKT, BUS_GCNMOS is not quite as effective at preventing data bit corruption due to the bus signal driver circuit 600 having lower impedance during hot-swap events compared to the bus signal driver circuit 400. However, BUS_GCNMOS is still an improvement over having no protection (see I2C_BUS in FIG. 2). The lower performance of BUS_GCNMOS compared to BUS_NEW CKT is due to M9, C4, and R6 only allowing the control terminal of M9 to rise up DRIVE_GATE.

Figure 8:
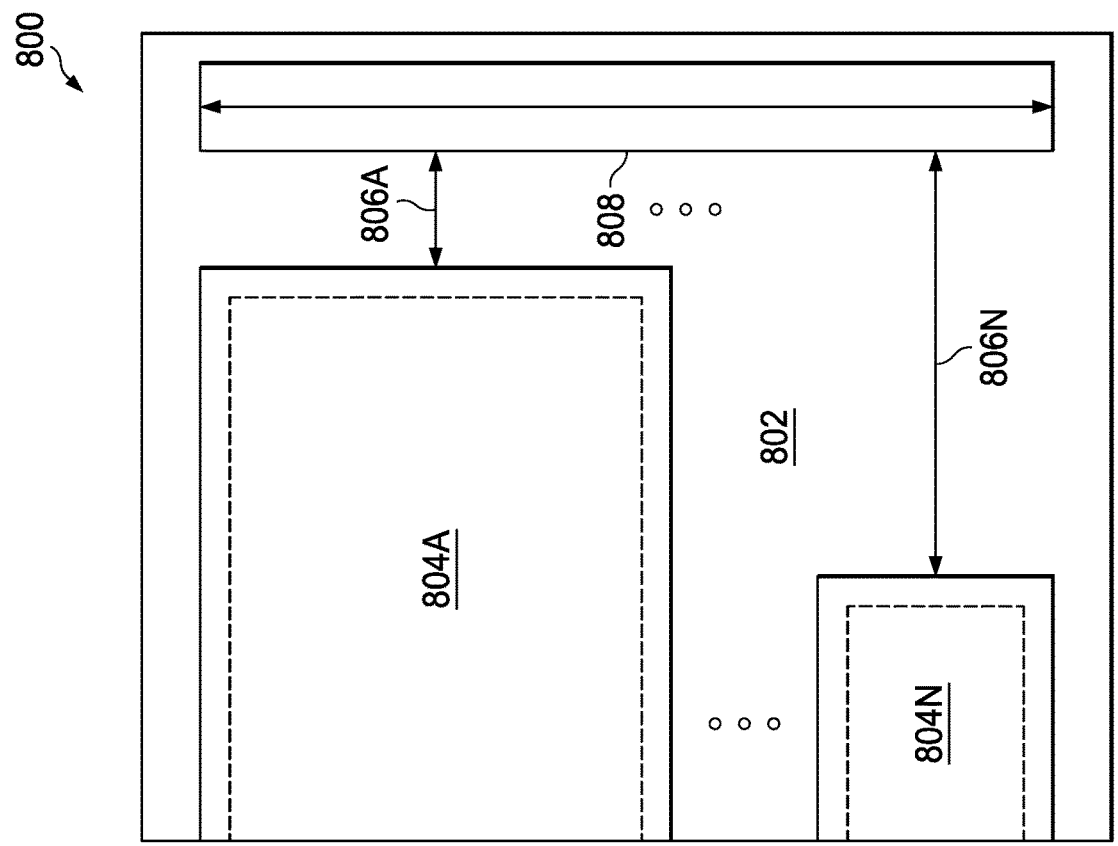
FIG. 8 is a diagram of a system with hot-swappable PCB cards in accordance with an example embodiment.
Figure 8:
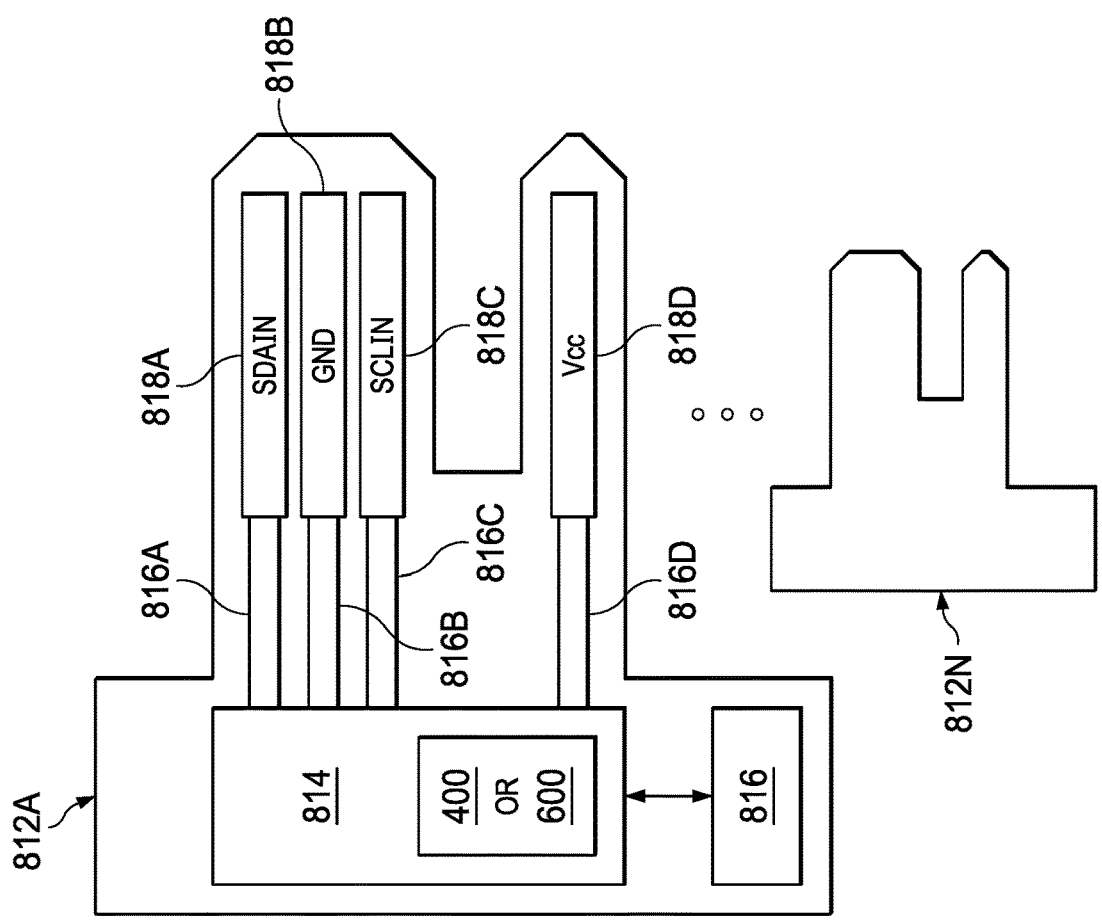

FIG. 8 is a diagram of a system 800 with hot-swappable PCB cards in accordance with an example embodiment. In the system 800, PCB cards 812A-812N can be plugged into or unplugged from an electrical device 802 (e.g., a data center server or other electrical device) with respective connectors 804A-804N and a shared backplane 808 (e.g., an I2C backplane) with traces 806A-806N extending to each of the connectors 804A-804N.

As shown, the PCB card 812A includes unstaggered contacts 818A-818D. The unstaggered contact 818A is a SDAIN contact. The unstaggered contact 818B is a GND contact. The unstaggered contact 818C is a SCLIN contact. The unstaggered contact 818D is a power supply (Vcc) contact. As shown, the unstaggered contacts 818A-818D have the same approximate length.

In FIG. 8, the PCB card 812A also includes a communication interface buffer circuit 814 (e.g., an IC or other circuit) coupled to the unstaggered contacts 818A-818D via respective traces 816A-816D. In the example of FIG. 8, the communication interface buffer circuit 814 includes the bus signal driver circuit 400 or the bus signal driver circuit 600 of FIG. 6. In different example embodiments, the communication interface buffer circuit 814 also includes; a microcontroller, a digital isolator, and/or additional I2C buffers. With the signal driver circuit 400 or the bus signal driver circuit 600, the communication interface buffer circuit 814 is effective in avoiding corrupted bits on the shared backplane 808 due to hot-swapping events without the expense of staggered contacts.

The communication interface buffer circuit 814 is also coupled to another component 816 configured to perform target processing, sensing, storage, and/or other operations of the PCB card 812A and well as support a communication interface such as I2C. The PCB cards 812B-812N have the same components as the PCB card 812A, except that the other component 816 may vary with regard to type and related target operations.

Figure 9:
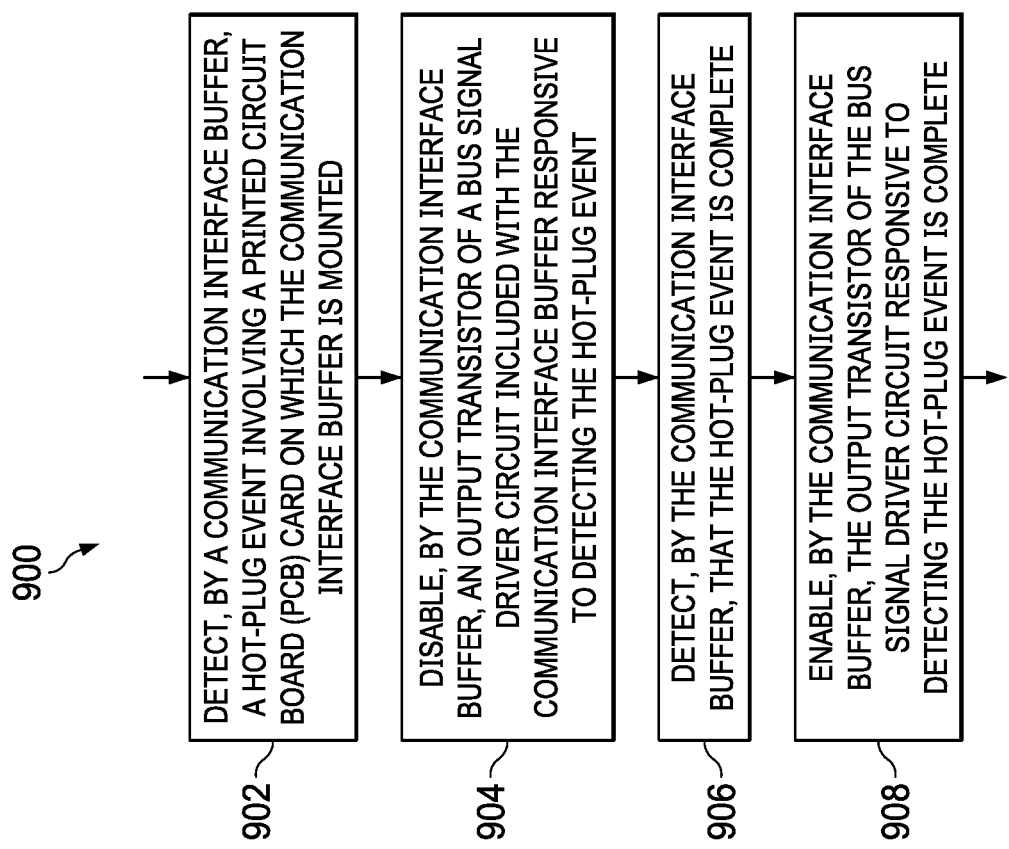
FIG. 9 is a flow chart of a method in accordance with an example embodiment.

FIG. 9 is a flow chart of a method 900 in accordance with an example embodiment. The method 900 is performed, for example, by a communication interface buffer (e.g., a communication interface buffer included with the communication interface buffer circuit 814 of FIG. 8). As shown, the method 900 includes a communication interface buffer detecting a hot-plug event involving a PCB card on which the communication interface buffer is mounted at block 902. At block 904, an output transistor (e.g., M6 in FIGS. 4 and 6) of a bus signal driver circuit (e.g., bus signal driver circuit 400 in FIG. 4 or bus signal driver circuit 600 in FIG. 6) included with the communication interface buffer is disabled responsive to detecting the hot-plug event. At block 906, the communication interface buffer detects that the hot-plug event is complete. At block 908, the communication interface buffer enables the output transistor of the bus signal driver circuit responsive to detecting the hot-plug event is complete. With the method 900, unstaggered contacts may be used with the PCB card while still avoiding data bit corruption on a shared communication interface as described herein. During a hot-plug event, the bus signal driver circuit and related communication interface buffer will be high-impedance relative to the shared communication interface and thus will not significantly alter data bits on the shared communication interface.

In some example embodiments, detecting that the hot-plug event is complete at block 906 includes detecting that a power supply voltage for the communication interface buffer reaches a target level and target stability. In some example embodiments, detecting the hot-plug event at block 902 includes detecting a voltage at a data bus connection of the bus signal driver circuit of the communication interface buffer. In some example embodiments, disabling the output transistor at block 904 involves pulling down a voltage at a control terminal of the output transistor using a first disable circuit. In some example embodiments, enabling the output transistor at block 908 involves disabling the first disable circuit using a second disable circuit.

In some example embodiments a communication interface buffer (e.g., a communication interface buffer of the communication interface buffer circuit 814 in FIG. 8) includes: a data bus connection (e.g., the DATA_BUS connection 410 in FIGS. 4 and 6) adapted to be coupled to a bus interface contact (e.g., a contact of one of the connectors 804A-804N). The communication interface buffer also includes a ground (e.g., ground 408 in FIGS. 4 and 6). The communication interface buffer also includes an output transistor (e.g., M6 in FIGS. 4 and 6) with a first current terminal, a second current terminal and a control terminal. The first current terminal is coupled to the data bus connection, the second current terminal is coupled to ground, and the control terminal is adapted to receive a drive signal (e.g., DRIVE_GATE). The communication interface buffer also includes a control circuit (e.g., control circuit 418 in FIG. 4, or control circuit 418A in FIG. 6) coupled to the control terminal of the output transistor. The control circuit is configured to: turn off the output transistor during a first interval that starts when the data bus connection is coupled to the bus interface contact; and turn on the output transistor after the first interval is complete.

In some example embodiments, the first interval ends when a power supply voltage (e.g., Vcc in FIGS. 4 and 6) for the communication interface buffer reaches a target level and target stability. In some example embodiments, the control circuit includes: a first disable circuit (e.g., the first disable circuit 414 in FIG. 4, or the first disable circuit 414A in FIG. 6) coupled to the control terminal of the output transistor and configured to selectively disable the output transistor; and a second disable circuit (e.g., the second disable circuit 416 in FIGS. 4 and 6) coupled to the first disable circuit and configured to selectively disable the first disable circuit.

In some example embodiments, the first disable circuit includes a first transistor (e.g., M7 in FIG. 4, or M9 in FIG. 6) having: a first current terminal coupled to the control terminal of the output transistor; a second current terminal coupled to ground; and a control terminal coupled to the second disable circuit. In some example embodiment, the first transistor is at least 10 times smaller than the output transistor with regard to a width/length ratio. In some example embodiments, the control circuit is powered via a coupling capacitor (e.g., C3 in FIG. 4) between the data bus connection and the control circuit. In some example embodiments, the communication interface buffer includes a slew rate control capacitor (e.g., C2 in FIGS. 4 and 6) coupled between the data bus connection and the control terminal of M6, where the coupling capacitor has a capacitance that is at least twice as small as a slew rate control capacitor.

In some example embodiments, the second disable circuit includes a second transistor (e.g., M8 in FIGS. 4 and 6) having: a first current terminal coupled to the control terminal of the first transistor; a second current terminal coupled to ground; and a control terminal adapted to receive a control signal (e.g., $\overline{POR}$ in FIGS. 4 and 6) that indicates when a power supply voltage (e.g., Vcc in FIGS. 4 and 6) for the communication interface buffer reaches a target level and target stability. In some example embodiments, the first disable circuit includes: a first transistor (e.g., M9 in FIG. 6) having: a first current terminal coupled to the control terminal of the output transistor; a second current terminal coupled to ground; and a control terminal coupled to the second disable circuit. The first disable circuit also includes a capacitor (e.g., C4 in FIG. 6) having a first side and a second side. The first side of the capacitor coupled to the control terminal of the output transistor, and the second side of the capacitor coupled to the control terminal of the first transistor. The first disable circuit also includes a resistor (e.g., R6 in FIG. 6) having a first side and a second side, the first side of the resistor coupled to the control terminal of the first transistor, and the second side of the resistor coupled to ground. In some example embodiments, the data bus connection is an I2C connection, and the communication interface buffer is part of an integrated circuit.

In some example embodiments, a system (e.g., the system 800 in FIG. 8) includes: a component (e.g., component 816 in FIG. 8) configured to perform a target operation and related communications. The system also includes a set of contacts (e.g., the contacts 818A-818D) adapted to be coupled to a connector (e.g., one of the connectors 804A-804N). The system also includes a communication interface buffer (e.g., a communication interface buffer of the communication interface buffer circuit 814 in FIG. 8) between the component and the set of contacts. In some example embodiments, the communication interface buffer includes: a bus signal driver circuit (e.g., the bus signal driver circuit 400 in FIG. 4, or the bus signal driver circuit 600 in FIG. 6) with a data bus connection (e.g., the DATA_BUS connection 410 in FIGS. 4 and 6) and a control circuit (e.g., the control circuit 418 in FIG. 4, or the control circuit 418A in FIG. 6) configured to change the input impedance at the data bus connection to be a first impedance during a first interval (e.g., during a hot-swap event) and a second impedance during a second interval (e.g., during a normal operations interval) after the first interval, the first impedance being greater than the second impedance. In some example embodiments, the component, the set of contacts and the communication interface buffer are part of a PCB card (e.g., one of the PCB cards 812A-812N in FIG. 8), the communication interface buffer is part of an integrated circuit, and the communication interface buffer supports I2C communications.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

As used herein, the terms "terminal", "node", "interconnection", "pin", "contact", and "connection" are used interchangeably. Unless specifically stated to the contrary, these terms are generally used to mean an interconnection between or a terminus of a device element, a circuit element, an integrated circuit, a device or other electronics or semiconductor component.

While the example embodiments above utilize nMOS and pMOS transistors, other example embodiments may utilize NPN bipolar junction transistors (BJTs), PNP BJTs, or any other type of transistor. Hence, when referring to a current terminal, such terminal may be an emitter, collector, source or drain. In addition, the control terminal may be a base or a gate.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value.

Modifications are possible in the described embodiments, and other embodiments are possible, within the scope of the claims.

What is claimed is:

1. A communication interface buffer, comprising:
   a data bus connection adapted to be coupled to a bus interface contact;
   a common potential;
   an output transistor with a first current terminal, a second current terminal and a control terminal, the first current terminal directly coupled to the data bus connection, the second current terminal coupled to the common potential, and the control terminal adapted to receive a drive signal; and
   a control circuit coupled to the control terminal of the output transistor, wherein the control circuit is configured to:
   turn off the output transistor during a first interval that starts when the data bus connection is coupled to the bus interface contact; and
   turn on the output transistor after the first interval is complete.

2. The communication interface buffer of claim 1, wherein the first interval ends when a power supply voltage for the communication interface buffer reaches a target level and target stability.

3. The communication interface buffer of claim 1, wherein the control circuit includes:
   a first disable circuit coupled to the control terminal of the output transistor and configured to selectively disable the output transistor; and
   a second disable circuit coupled to the first disable circuit and configured to selectively disable the first disable circuit.

4. The communication interface buffer of claim 3, wherein the first disable circuit includes a first transistor having a first current terminal coupled to the control terminal of the output transistor, a second current terminal coupled to ground, and a control terminal coupled to the second disable circuit.

5. The communication interface buffer of claim 1, wherein the first transistor is at least 10 times smaller than the output transistor with regard to a width/length ratio.

6. The communication interface buffer of claim 1, wherein the control circuit is powered via a coupling capacitor between the data bus connection and the control circuit.

7. The communication interface buffer of claim 6, further comprising a slew rate control capacitor coupled between the data bus connection and the control terminal of the output transistor, wherein the coupling capacitor has a capacitance that is at least twice as small as the slew rate control capacitor.

8. The communication interface buffer of claim 4, wherein the second disable circuit includes a second transistor having a first current terminal coupled to the control terminal of the first transistor, a second current terminal coupled to ground, and a control terminal adapted to receive a control signal that indicates when a power supply voltage for the communication interface buffer reaches a target level and target stability.

9. The communication interface buffer of claim 3, wherein the first disable circuit includes:
- a first transistor having a first current terminal coupled to the control terminal of the output transistor, a second current terminal coupled to ground, and a control terminal coupled to the second disable circuit;
- a capacitor having a first side and a second side, the first side of the capacitor coupled to the control terminal of the output transistor, and the second side of the capacitor coupled to the control terminal of the first transistor; and
- a resistor having a first side and a second side, the first side of the resistor coupled to the control terminal of the first transistor, and the second side of the resistor coupled to ground.

10. The communication interface buffer of claim 1, wherein the data bus connection is an I2C connection, and the communication interface buffer is part of an integrated circuit.

11. A driver circuit comprising:
- a signal input;
- a signal output;
- an output transistor having a first control terminal, a first current terminal and a second current terminal, the first current terminal directly coupled to the signal output and the second current terminal coupled to a common potential that is adapted to be coupled to ground;
- a first disable transistor having a second control terminal, a third current terminal and a fourth current terminal, the third current terminal coupled to the first control terminal, the fourth current terminal coupled to the common potential; and
- a second disable transistor having a third control terminal, a fifth current terminal and a sixth current terminal, the third control terminal coupled to a control signal, the fifth current terminal coupled to the signal output through a first capacitor and the sixth current terminal coupled to the common potential.

12. The driver circuit of claim 11, further comprising: a second capacitor coupled between the signal output and the first control terminal.

13. The driver circuit of claim 11, further comprising:
- a first transistor having a fourth control terminal, a seventh current terminal and an eighth current terminal, the fourth control terminal coupled to the signal input, the seventh current terminal is adapted to be coupled to a voltage supply; and
- a second transistor having a fifth control terminal, a ninth current terminal and a tenth current terminal, the fifth control terminal coupled to the signal input, the ninth current terminal coupled to the eight current terminal and the tenth current terminal coupled to the common potential.

14. The driver circuit of 11, wherein the output transistor turns off in response to the first transistor being turned on.

15. The driver circuit of claim 11, wherein the signal input is coupled to the signal output in response to the output transistor turning off.

16. The driver circuit of claim 11, wherein the driver circuit is incorporated in a communication interface buffer that supports I2C communications.

* * * * *